United States Patent
Linam et al.

(10) Patent No.: US 6,600,353 B2
(45) Date of Patent: Jul. 29, 2003

(54) RECEIVER APPARATUS AND METHOD OF PROPAGATING A SIGNAL

(75) Inventors: David L. Linam, Fort Collins, CO (US); Christopher George Helt, Fort Collins, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/037,136

(22) Filed: Nov. 1, 2001

(65) Prior Publication Data

US 2003/0080785 A1 May 1, 2003

(51) Int. Cl.⁷ ................................................. H03K 5/12
(52) U.S. Cl. ......................... 327/170; 327/72; 327/408
(58) Field of Search ............................. 327/72, 23, 24, 327/165, 172, 403, 407, 404, 408, 170, 70

(56) References Cited

U.S. PATENT DOCUMENTS 5,978,312 A * 11/1999 Manning .................. 365/233.5

* cited by examiner

Primary Examiner—Dinh T. Le

(57) ABSTRACT

An apparatus and method permits quick response to a transition at an input port and subsequent propagation of the transition to the output port while being able to process a wide variety of input signal properties. A receiver apparatus comprises at least first and second receivers, each receiver accepting an input signal and tuned for optimal response to a set of known input signal properties. Either first and second primary transition propagation elements or secondary transition propagation element propagates a first transition from one of the receivers. A universal transition propagation element propagates the first transition to an output. A pass gate receives a signal based upon the output and inhibits transmission of the signal based upon the output until the first and second intermediate signals are equivalent whereupon the pass gate is placed in low impedance state permitting the signal based upon the output to be held in a storage node as the preset signal.

25 Claims, 3 Drawing Sheets

US 6,600,353 B2

RECEIVER APPARATUS AND METHOD OF PROPAGATING A SIGNAL

BACKGROUND

Certain integrated circuits ("ICs") are designed to receive varying types of input signals. These input signals typically have varying types and levels of signal degradation. Signal degradation affects the speed with which a receiver is able to reliably respond. Speed of response, however, is an important feature in a receiver. It is possible to tune a receiver for fastest response if the type of signal degradation is known. Sufficient knowledge of the signal degradation characteristics, however, is typically not available or varies in the application for which the receiver is intended to function. Additionally, it is advantageous for an IC to be able to interoperate with other ICs in a wide variety of signal environments. As electrical circuits become faster and more sophisticated, the response time becomes more of a disadvantage and affects overall performance of the IC. Similarly, it is disadvantageous to require a level of signal quality within a narrow range of input signal characteristics. A requirement such as this forces compromises upstream of the receiver that may affect overall performance of a product into which the IC is used or may convince a buyer of the IC that an alternative product and vendor is preferable.

There is a need, therefore, for a receiver apparatus that is capable of accepting a wide variety of signal types and signal degradation while also capable of quick response.

SUMMARY

In view of the need in the art, a receiver apparatus accepts an input signal and comprises first and second receivers, each receiver accepting the input signal and each receiver tuned for optimal response to a set of known input signal properties. Each receiver produces first and second intermediate signals respectively, one of the receivers produces a first transition. The apparatus further comprises first and second primary transition propagation elements, and a secondary transition propagation element. A preset signal prepares the first and second primary transition propagation elements and the secondary transition propagation element to propagate the first transition to an input of an output transition propagation element. The output transition propagation element accepts and propagates the first transition to an output of said output transition propagation element. A pass gate accepts a signal at an input of the pass gate, the signal being based upon the output of the output transition propagation element. The pass gate inhibits presentation of the signal at an output of the pass gate as the preset signal until the first and second intermediate signals are equivalent.

A method of propagating an input signal comprises the steps of accepting the input signal into a plurality of receivers to create a plurality of intermediate signals, one of which propagates a first transition. The method further comprises preparing first and second primary propagation elements and a secondary transition propagation element to propagate a first transition and propagating the first transition to an output. The method further comprises transmitting a signal based upon the output as a preset signal when all of the plurality of intermediate signals are equivalent and inhibiting the preset signal when the plurality of intermediate signals is not equivalent, and storing a previous preset signal until all of the plurality of intermediate signal is equivalent.

Advantageously, an apparatus and method according to the teachings of the present invention permits quick response to a transition at an input port and subsequent propagation of the transition to the output port while being able to process a wide variety of input signal properties.

DETAILED DESCRIPTION

Figure 1:
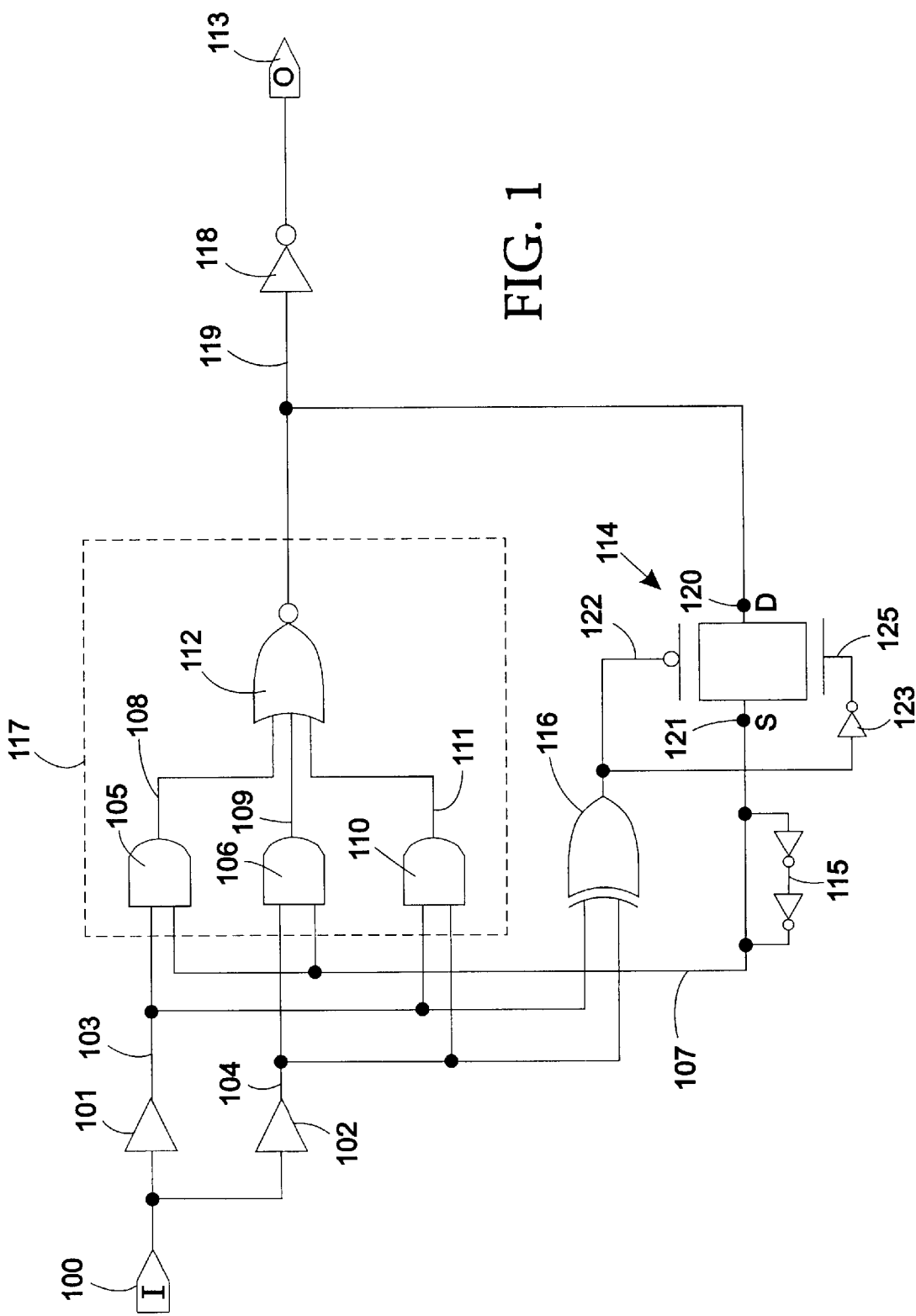
FIG. 1 is a circuit diagram of a receiver apparatus according to the teachings of the present invention.

With specific reference to FIG. 1 of the drawings, there is shown a receiver apparatus according to the teachings of the present invention in which an input signal is received by the receiver apparatus via input port 100. First and second receivers 101, 102 are single-ended receivers in FIG. 1 and both receive the same input signal. The outputs of the first and second receivers 101, 102 comprise first and second intermediate signals 103, 104, respectively. The first intermediate signal 103 is fed into first primary transition propagation element 105, an AND gate, secondary transition propagation element 110, also an AND gate, and equivalence detection element 116. In a 2-port embodiment according to the teachings of the present invention, the equivalence detection element 116 comprises an EXCLUSIVE NOR gate which is shown in the drawings as an EXCLUSIVE OR in series with an INVERTER 123. The second intermediate signal 104 is fed into second primary transition propagation element 106, an AND gate, the secondary transition propagation element 110, and the equivalence detection element 116. An output of the first primary transition propagation element 105 is a first primary propagation signal 108, an output of the second primary transition propagation element 106 is a second primary propagation signal 109, and an output of the secondary transition propagation element 110 is a secondary propagation signal 111. The first and second primary propagation signals 108, 109 and the secondary propagation signal 111 are disjunctively combined in an output transition propagation element 112, which in the illustrated embodiment comprises a 3-input NOR gate. The output transition propagation element 112 propagates output transition signal 119, which is inverted at output inverter 118 before being presented at output port 113. The output transition signal 119 is sampled and connected to a drain terminal 120 of pass gate 114. The embodiment shown in FIG. 1 includes a CMOS pass gate configuration comprising a PFET and an NFET connected in parallel with common drain and source terminals 120, 121. Due to the fact that the NFET and PFET are symmetrical devices, the source and drain terminology is used for clarity. Alternative embodiments may use a single FET pass gate configuration. The pass gate 114 permits the value presented at the drain terminal 120 to pass through the pass gate 114 to the source terminal 121 only when the first and second intermediate signals 103, 104 are equivalent. Otherwise, the pass gate 114 presents a high impedance circuit between the drain terminal 120 and the source terminal 121 and the output transition signal 119 is not permitted to pass. When the first and second intermediate signals 103, 104 are equivalent, an NFET gate 125 of the pass gate 114 is presented with a high value and a PFET gate 122 of the pass gate 114 is presented with a complement of the value seen by the NFET gate 125. In this state, the pass gate 114 presents a low impedance path between the drain terminal 120 and source terminal 121. The output transition signal 119, therefore, is presented at the source terminal 121 and sets a value for preset signal 107. When the first and second intermediate signals 103, 104 are not equivalent, the NFET gate 125 of the pass gate 114 is presented with a low value and the PFET gate 122 of the pass gate 114 is presented with the complement of the value seen by the NFET gate 125. In this state, the pass gate 114 presents a high impedance path between the drain terminal 120 and the source terminal 121 and the storage node 115 holds the preset signal 107.

Each one of the first and second receivers 101, 102 are tuned to optimally respond to an input signal having different sensitivity and response characteristics to one or more signal properties, such as common mode voltage, slew rate, and signal jitter. The outputs of each receiver 101, 102, therefore, have different propagation delays depending upon characteristics of the signal received. Because each receiver 101, 102 is tuned to optimally respond to a different set of signal properties, one of the two intermediate signals 103, 104 transitions before the other. The first and second primary transition propagation elements 105, 106 conjunctively combine respective first and second intermediate signals 103, 104 with the preset signal 107. The preset signal 107 holds the complement of the value of the previous value presented to the output port 113. Within the circuit, the preset signal 107 "arms" the circuit to receive and propagate the next transition. The arming comprises sensitizing either the first and second primary transition propagation elements 105, 106 or the secondary transition propagation element 110 to recognize and then propagate a transition that is to a logic value different from the current output value. In the specific example shown in FIG. 1 of the drawings, the first and second primary transition propagation elements propagate a transition from a low ("0") to a high ("1") logic value. When the input 100 and the output 113 both have a low logic value, the first and second primary transition propagation elements are armed with a high logic value for the preset signal 107 to propagate a first low to high transition on either the first or second intermediate signals 103 or 104. In the low to high transition, the secondary transition propagation element 110 does not perform a transition propagation function. When the input 100 and the output 113 are both high, the secondary transition propagation element 110 is armed with the preset signal 107 to propagate a transition from the high to a low logic value. In the high to low transition, the primary transition propagation elements 105, 106 do not perform a transition propagation function.

In the case where the previous output value is low, in a steady state condition, the value at the input port 100 is low, the first and second intermediate signals 103, 104 are low, the value at the output port 113 is low, and the pass gate 114 is in a low impedance state because the first and second intermediate signals 103, 104 are equivalent. In this state, the receiver apparatus is waiting and is armed for a low to high transition. When a low to high transition occurs, because the preset signal is high, one of the first or second primary transition propagation elements 105, 106 propagates the low to high transition to its output first. The output transition propagation element 112, which in a steady state had all inputs with low values, now sees a high value on one of its inputs and changes its output state to reflect the change. In this case, the output of the output transition propagation element 112 changes state to a low value. The output inverter 118 inverts the output of the output transition propagation element 112 to present a high value at the output port 113.

The output transition signal 119, a low value, is then presented at the drain terminal 120 of the pass gate 114. During the time when only one of the receivers 101, 102 has responded to the signal at the input port 100, the first and second intermediate signals 103, 104 are not equivalent. Accordingly, the equivalence detection element 116 presents a low value to the NFET gate 125 and a high value to the PFET gate 122 of the pass gate 114. Accordingly, the electrical connection from the drain terminal 120 to the source terminal 121 is a high impedance path. The output transition signal 119, therefore, presents a low value at the drain terminal 120 while the preset signal 107 remains at a high value as driven by the storage node 115. When the slower of the receivers 101 or 102 responds to the value at the input port 100, the changes at the input of the output transition propagation element 112 do not cause any change to the output transition signal. Advantageously, the signal present at the output port 113 remains stable after the first receiver to transition and before the last receiver to transition actually does transition. When all of the receivers 101 and 102 have transitioned, all inputs to the equivalence detection element 116 are equivalent and the output of the equivalence detection element 116 transitions to a low value. The high value presented to the NFET gate 125 and low value presented to the PFET gate 122 of the pass gate 114 causes the pass gate 114 to present a low impedance path between the drain terminal 120 and source terminal 121, thereby transitioning the preset signal 107 to a value that is the inverse of the value at the output port 113. In the present example, the preset signal 107 transitions to a low value while the values at the input port 100 and the output port 113 remain at a high value.

In the opposite case where the previous output value is high, in a steady state condition, the value at the input port 100 is high, the first and second receivers 101, 102 are high, the value at the output port 113 is high, and the pass gate 114 is in a low impedance state because the first and second intermediate signals 103, 104 are equivalent. In this state, the receiver apparatus is waiting to process a high to low transition. When a high to low transition occurs, because the preset signal 107 is low, any transition of either one of the first or second intermediate signals 103, 104 does not propagate through the first or second primary transition propagation elements 105, 106. The outputs of the first and second primary transition propagation elements 105, 106 are held at a constant low value due to the conjunctive combination with the low valued preset signal 107. Accordingly, any transition at the input port 100 is propagated with the secondary transition propagation element 110. When one of the first or second intermediate signals 103, 104 transitions from a high to a low, the secondary transition propagation element 110 propagates the low to the respective input of the output transition propagation element 112. Because the other inputs to the output transition propagation element 112 are held low by the conjunctive combination with the preset signal 107, the output of the secondary transition propagation element 110 is determinative of the output of the output transition propagation element 112 and the output transition signal 119 changes from a low to a high value. The output inverter 118 inverts the output transition signal 119 to present a low value at the output port 113. The output transition signal 119 is fed back to the drain terminal 120 of the pass gate 114. The pass gate 114 presents a high impedance path between the drain terminal 120 and the source terminal 121 because only one of the first and second receivers 101, 102 has transitioned, the inputs to the equivalence detection element 116 are not equivalent, which drives the equivalence detection output and, therefore, the pass gate 114 to a high impedance state. The storage node 115, however, drives the preset signal 107 to the value of the complement of the output port 113 in a steady state condition and prior to the transitions being processed, which in this case is a low value. When the last of the receivers 103, 104 has propagated the transition at the input port 100, and the first and second intermediate signals 103, 104 are equivalent, the equivalence detection output transitions to a low value, thereby causing the pass gate 114 to present a low impedance path between the drain terminal 120 and the source terminal 121. The preset signal 107, therefore, changes state to a high value awaiting the next transition.

As one of ordinary skill in the art appreciates, the receiver apparatus according to the teachings of the present invention propagates a transition at the input port 100 to the output port 113 in a minimum amount of time and over a broad range of input signal properties. In a CMOS embodiment of the circuit, the first and second primary transition propagation elements 105, 106, the secondary transition propagation element 110, and the output transition propagation element 112 is implemented as an AND-OR-INVERT gate 117, which is a single logic level. This provides a minimum number of logic stages between the output of the first and second receivers 103 and 104 and the output port 113 to further assure speedy transition propagation. The output port 113 maintains a stable signal during the processing of the transition through the slower of the receivers 101 or 102.

Figure 2:
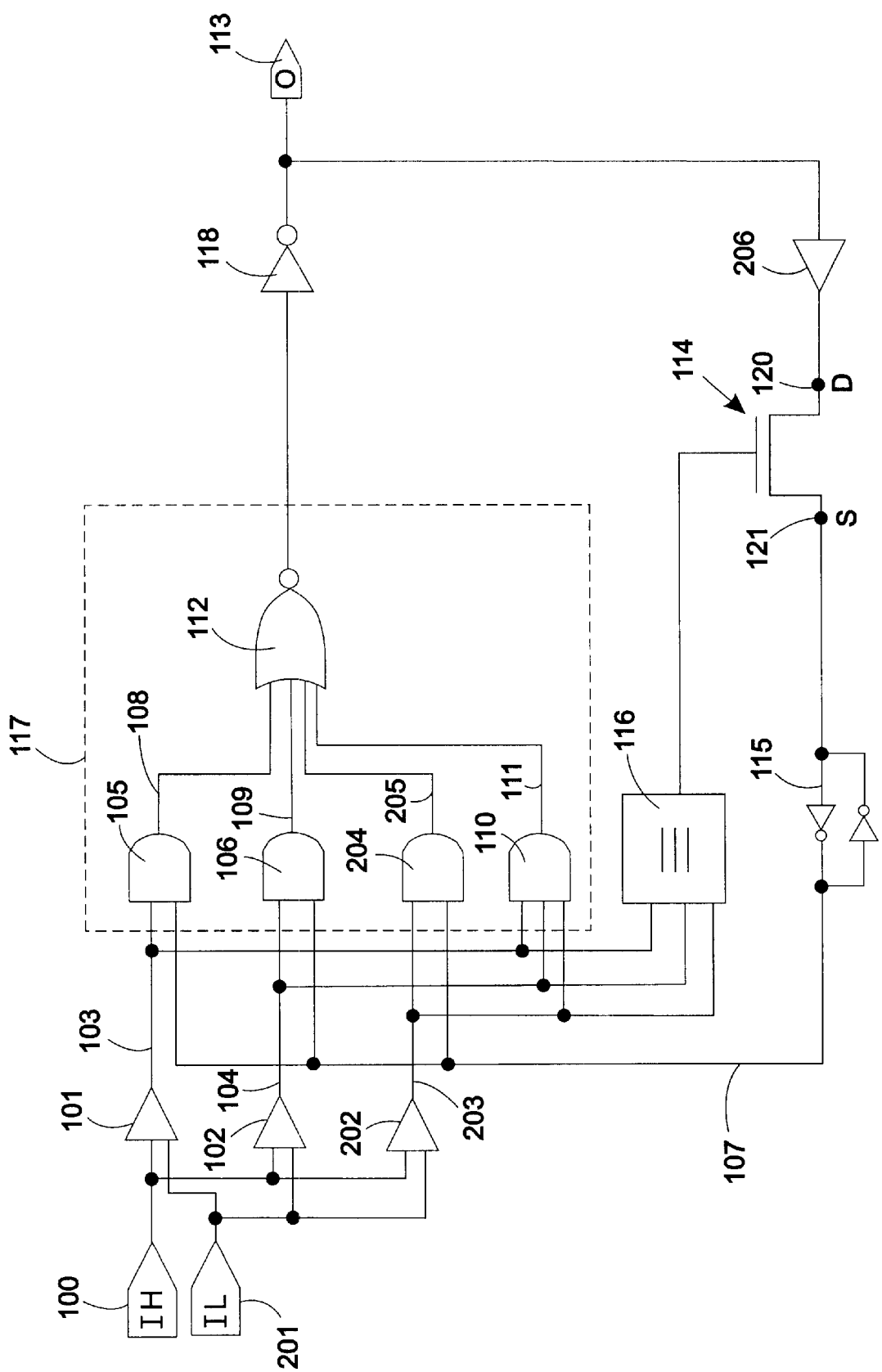
FIG. 2 is a circuit diagram of another embodiment of a receiver apparatus according to the teachings of the present invention.

With specific reference to FIG. 2 of the drawings, there is shown another embodiment of a receiver apparatus according to the teachings of the present invention in which there are first, second, and third receivers 101, 102, 202, respectively which are differential receivers receiving an input signal from differential input ports comprising input port high 200 and input port low 201. Additional receivers of either the single-ended or differential variety may be used to scale the circuit as appropriate without departing from the teachings of the present invention. As an illustrative example, FIG. 2 includes third receiver 202 generating third intermediate signal 203 that is fed into third primary transition propagation element 204. The first, second, and third primary transition propagation elements 105, 106, 204, respectively, are all two input gates similar to those in FIG. 1, while the secondary transition propagation element 110 accommodates first and second intermediate signals 103, 104, as well as third intermediate signal 203. The universal transition propagation element 112 accepts primary propagation signals 108, 109 as well as third primary propagation signal 205 and the secondary propagation signal 111. In a CMOS embodiment, however, the primary transition propagation elements 105, 106, 204, the secondary transition propagation element 110, and the output transition propagation element 112 may be implemented as the AND-OR-INVERT gate 117, which represents a single logic level. An alternate implementation of the output feed back circuit is shown in FIG. 2 of the drawings, where the feedback signal is sampled on an output side of the output inverter 118 and there is a single FET pass gate configuration shown as 114 which is implemented using an NFET. If the output is sampled on the output side of the output inverter 118, then an appropriate implementation inverts the feedback signal again to present the preset signal 107. This may be accomplished using an inverting storage node 115 on the source terminal 121 side of the pass gate 114 or a non-inverting storage node may be used with another inverter (not shown) being placed somewhere in the feed back path so that the preset signal 107 is a inverted value of the previous steady state value at the output port 113. The equivalence detection element 116 is a 3-port element in this embodiment. Because a 3-port equivalence detection element does not have a standard logic symbol, it is represented in the drawings as a box with an equivalence designation label. In the illustration, the output of the equivalence detector 116 goes high when all inputs are equivalent and remains low when any one of the inputs have a value different from the other inputs. Additionally, a delay element 206 may be placed in the feedback path before the drain terminal 120 of the pass gate 114. As one of ordinary skill in the art appreciates, the speed critical portion of the circuit is the path between the input port 100 or 200/201 and the output port 113. The feedback path from the output port 113 to the primary and secondary transition propagation elements 105, 106, 204, 110 is less critical and need only be fast enough so as not to compromise the speed with which the entire receiver apparatus is able to process transitions. The delay element 206 serves to assure that the equivalence detection element 116 and pass gate 114 are able to respond to the first transition so as to present a high impedance path between the drain terminal 120 and the source terminal 121 of the pass gate 114 when the value at the drain terminal 120 reflects a value different from the value at the source terminal 121.

Figure 3:
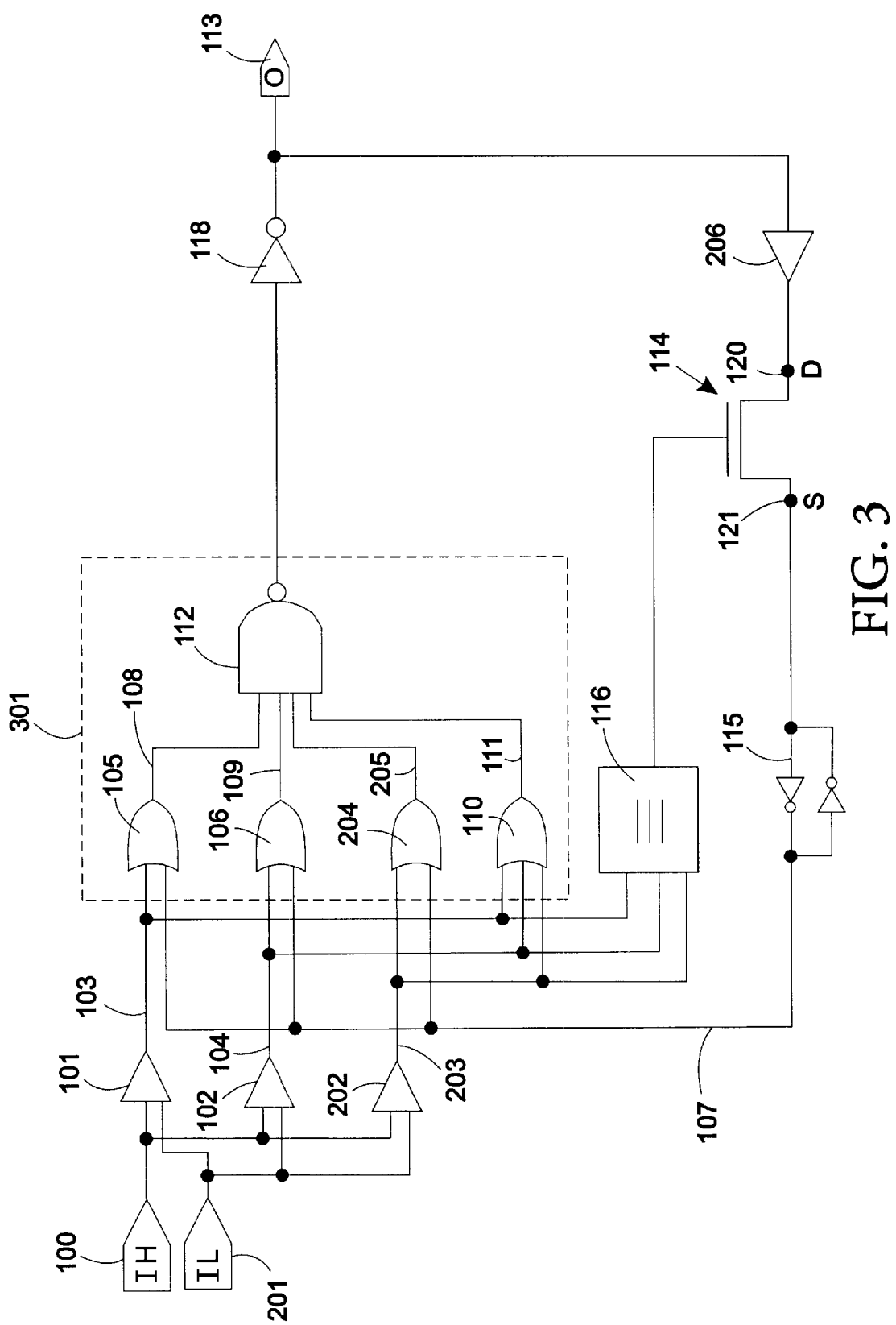
FIG. 3 is a circuit diagram of another embodiment of a receiver apparatus according to the teachings of the present invention.

With specific reference to FIG. 3 of the drawings, there is shown another embodiment according to the teachings of the present invention in which the AND-OR-INVERT gate 117 (FIG. 1) is replaced with its Boolean equivalent OR-AND-INVERT gate 301. Specifically, the first and second primary transition propagation elements 105, 106, 204 and the secondary transition propagation element 110 may be OR gates. In this case, the universal transition propagation element 112 is a NAND gate. As one of ordinary skill in the art appreciates with benefit of the present disclosure, any odd number of inversions in the electrical path between the output 113 and the point at which the preset signal 107 is used to arm the primary and secondary transition propagation elements 105, 106, 204, 110 is appropriate. FIG. 3 shows an inverting storage node 115 on the source terminal 121 side of the pass gate 114 as an example of an appropriate configuration.

Other embodiments of the present invention include without limitation, implementation of the circuit using any integrated circuit technology and implementation of the circuit using a different set of logic gates to arrive at the similar function. In addition any number of receivers may be used, although anywhere from two to four receivers is believed to be optimum to achieve the stated advantages. Single-ended receivers or differential receivers may be used at the input port 100 or 200/201 as appropriate. The one or more delay elements 206 may be used in the feedback circuit or no delay elements at all may be used depending upon the timing needs of the feed back loop. Single FET or CMOS pass gate configurations may be used. The speed with which a transition may be propagated from the output of the receivers 101, 102, 202 to the output 113 of the receiver apparatus provides a receiver apparatus transition time. In order to prevent glitches on the output 113, the pass gate 114 should be in a high impedance state before the first transition propagates to the drain terminal 120. The delay element 206 assures this timing, but also affects the speed with which the receiver apparatus is able to rearm for a next transition, which limits the signal frequency that the receiver apparatus is able to accommodate. Any combination of inverters and inverting or non-inverting storage nodes may be used to achieve the proper polarities for operation of the circuit. Other embodiments may be apparent to one of ordinary skill in the art with benefit of the teachings presented herein.

What is claimed is:

1. A receiver apparatus accepting an input signal comprising:

first and second receivers, each said receiver accepting said input signal and each said receiver tuned for optimal response to a set of known input signal properties, each said receiver producing first and second intermediate signals respectively, one of said receivers producing a first transition, first and second primary transition propagation elements, a secondary transition propagation element, a preset signal preparing said first and second primary transition propagation elements and said secondary transition propagation element to propagate said first transition to an input of an output transition propagation element, said output transition propagation element accepting and propagating said first transition to an output of said output transition propagation element, a pass gate accepting a signal at an input of said pass gate, said signal being based upon said output of said output transition propagation element, said pass gate inhibiting presentation of said signal at an output of said pass gate as said preset signal until said first and second intermediate signals are equivalent.

2. A receiver apparatus as recited in claim 1 and further comprising a third receiver accepting said input signal and tuned for optimal response to a set of know input signal properties and producing a third intermediate signal, wherein a third primary transition propagation elements accepts said third intermediate signal and is prepared by said preset signal, and said secondary transition propagation element accepts said third intermediate signal.

3. A receiver apparatus as recited in claim 1 and further comprising a delay buffer between said output signal and an input of said pass gate.

4. A receiver apparatus as recited in claim 1 and further comprising a storage node disposed between said output of said pass gate and said primary and secondary propagation elements, wherein said storage node comprises a parallel combination of a short circuit and first and second inverters in series with each other.

5. A receiver apparatus as recited in claim 1 and further comprising a storage node disposed between said output of said pass gate and said primary and secondary propagation elements, wherein said storage node comprises a first inverter with an input of a second inverter connected to an output of said first inverter and an output of said second inverter connected to an input of said first inverter.

6. A receiver apparatus as recited in claim 1 wherein said first and second receivers are single ended receivers.

7. A receiver apparatus as recited in claim 2 wherein said first, second, and third receivers are single ended receivers.

8. A receiver apparatus as recited in claim 1 wherein said first and second receivers are differential receivers.

9. A receiver apparatus as recited in claim 2 wherein said first, second, and third receivers are differential receivers.

10. A receiver apparatus as recited in claim 1 where said circuit uses CMOS technology.

11. A receiver apparatus as recited in claim 10 wherein said first and second primary transition propagation elements, said secondary transition propagation element, and said universal transition propagation element are implemented with an AND-OR-INVERT gate CMOS element.

12. A receiver apparatus as recited in claim 10 wherein said first and second primary transition propagation elements, said secondary transition propagation element, and said universal transition propagation element are implemented with an OR-AND-INVERT gate CMOS element.

13. A receiver apparatus as recited in claim 2 where said circuit uses CMOS technology.

14. A receiver apparatus as recited in claim 13 wherein said first, second, and third primary transition propagation elements, said secondary transition propagation element, and said universal transition propagation element are implemented using an AND-OR-INVERT gate CMOS element.

15. A receiver apparatus as recited in claim 13 wherein said first, second, and third primary transition propagation elements, said secondary transition propagation element, and said universal transition propagation element are implemented using an OR-AND-INVERT gate CMOS element.

16. A receiver apparatus as recited in claim 1 wherein an equivalence gate receives first and second intermediate signals and transitions to a state to place said pass gate in a high impedance state when said first and second intermediate signals are equivalent.

17. A receiver apparatus as recited in claim 2 wherein an equivalence gate receives first and second intermediate signals and transitions to a state to place said pass gate in a high impedance state when said first and second intermediate signals are equivalent.

18. A method of propagating an input signal comprising the steps of:

accepting the input signal into a plurality of receivers to create a plurality of intermediate signals, one of which propagates a first transition, preparing first and second primary propagation elements and a secondary transition propagation element to propagate said first transition, propagating said first transition to an output, transmitting a preset signal when all of said plurality of intermediate signals are equivalent, inhibiting said preset signal when said plurality of intermediate signals are not equivalent, and storing a previous preset signal until all of said plurality of intermediate signal are equivalent.

19. A method of receiving an electronic signal as recited in claim 18 and further comprising the step of tuning each one of said plurality of receivers for optimal response to a different set of signal properties.

20. A method of receiving an electronic signal as recited in claim 18 and further comprising the steps of inverting said signal based upon said output wherein said step of storing further comprises inverting said previous signal based upon said output as said preset signal until all of said outputs of said plurality of receivers are equivalent.

21. A method of propagating an input signal as recited in claim 18 wherein said step of accepting comprises receiving a single-ended input signal.

22. A method of propagating an input signal as recited in claim 18 wherein said input signal is a differential signal.

23. A method of propagating an input signal as recited in claim 18 and further comprising delaying propagation of said signal based upon said output prior to the step of transmitting said signal based upon said output as a preset signal.

24. A method of propagating an input signal as recited in claim 18 wherein said step of transmitting utilizes a pass gate responsive to an equivalence gate that changes to a positive state when all inputs to said equivalence gate are equivalence.

25. A receiver apparatus comprising:

means for receiving an input signal, said means for receiving having a plurality of means for optimally responding to a different set of known input signal conditions, means for preparing first and second primary propagation elements and a secondary propagation element to propagate a first transition received from said means for receiving, means for propagating said first transition to an output, means for feeding back a signal based upon said output as a preset signal when all outputs of said plurality of receivers are equivalent, means for inhibiting said preset signal when all outputs of said plurality of receivers are not equivalent, and means for storing said preset signal until all of said outputs of said plurality of receivers are equivalent.

* * * * *